United States Patent
Billiet et al.

(10) Patent No.: US 6,780,353 B2
(45) Date of Patent: Aug. 24, 2004

(54) METHOD FOR MAKING MICROMOLDS

(76) Inventors: Romain L. Billiet, 135A Malacca St., Penang 10400 (MY); Hanh T. Nguyen, 135A Malacca St., Penang 10400 (MY)

( * ) Notice: Subject to any disclaimer, the term of this patent is extended or adjusted under 35 U.S.C. 154(b) by 332 days.

(21) Appl. No.: 09/976,393

(22) Filed: Oct. 8, 2001

(65) Prior Publication Data

US 2002/0037233 A1 Mar. 28, 2002

Related U.S. Application Data

(60) Provisional application No. 60/240,632, filed on Oct. 16, 2000, and provisional application No. 60/237,360, filed on Sep. 26, 2000, now abandoned.

(51) Int. Cl.$^7$ .............................. C04B 33/32; B22F 3/10
(52) U.S. Cl. ..................... 264/40.1; 264/656; 419/10; 419/23; 419/36
(58) Field of Search ................. 419/10, 23, 36

(56) References Cited

U.S. PATENT DOCUMENTS

| | | | |
|---|---|---|---|
| 5,234,655 A | | 8/1993 | Wiech, Jr. |
| 5,735,985 A | | 4/1998 | Ghosh et al. |
| 5,915,695 A | * | 6/1999 | Wisocki et al. ............. 273/362 |
| 5,976,457 A | * | 11/1999 | Amaya et al. |
| 6,008,281 A | * | 12/1999 | Yang et al. |
| 6,027,630 A | * | 2/2000 | Cohen |

* cited by examiner

*Primary Examiner*—Christopher A. Fiorilla
(74) *Attorney, Agent, or Firm*—Foley & Lardner

(57) ABSTRACT

Ultrasmall, complex-shaped high-precision micromolds are produced by controlled shrinkage upon sintering of green parts molded from mixtures of micrometer- or nanometer-sized particulates dispersed in an organic binder.

7 Claims, No Drawings

METHOD FOR MAKING MICROMOLDS

CROSS-REFERENCE TO RELATED APPLICATIONS

This application claims priority to U.S. Provisional Patent Application Serial No. 60/240,632 filed on Oct. 16, 2000.

This invention is related to U.S. Provisional Patent Application Serial No. 60/237,360 filed Sep. 26, 2000 now abandoned and entitled: 'Method For Controlling The Dimensions Of Bodies Made From Sinterable Material', presently the subject of a U.S. Non-Provisional Patent Application filed on Sep. 20, 2001.

REFERENCE CITED

| U.S. Pat. No. Documents | | | |
|---|---|---|---|
| 5,234,655 | August 1993 | Wiech | 264/227 |
| 5,735,985 | April 1998 | Ghosh, et al. | 156/244.11 |

STATEMENT REGARDING FEDERALLY SPONSORED RESEARCH OR DEVELOPMENT

Not Applicable

REFERENCE TO A MICROFICHE APPLENDIX

Not Applicable

BACKGROUND—FIELD OF INVENTION

The present invention relates to the fabrication of micromolds and micromold components. More specifically, the present invention relates to the miniaturization of parts beyond the capability limits of current manufacturing technologies.

BACKGROUND—DESCRIPTION OF PRIOR ART

The universal trend, in the electronics, aerospace, medical and other fields of industry, toward smaller, more complex, lighter, more tightly toleranced, and more highly integrated products to be used in more aggressive, corrosive, hotter or constrained environments, creates a situation which has pushed current manufacturing technologies to their limits of capability.

Hence new manufacturing techniques to mass-produce parts with design features in the micrometer or even nanometer range are urgently needed and, indeed, will become a vital condition for progress and economic survival.

On engineering drawings, linear dimensions are usually toleranced by applying a widely accepted tolerance grading system such as the International Tolerance (IT) grades as outlined in ANSI B4.2. IT grades range from IT01 to IT16 and above, each grade corresponding to a range of tolerances depending on the basic size to which the tolerance applies. For instance the IT4 grade on a basic dimension of 5 mm is 0.004 mm, meaning that the part dimension has to be held within 5.002 mm and 4.998 mm. An IT12 grade on the same basic size is 0.120 mm, meaning that the 5 mm dimension now has to be held within plus or minus 0.120 mm. IT grades for mass-produced items usually range from IT12 through IT16.

Each type of machining process has its particular range of IT grades it can achieve. For instance lapping and honing usually cover the IT4 through IT5 grades whilst milling, drilling and punching operations generally cannot do better than an IT10 grade.

Developments in modem machine tools have been mainly driven by efforts to increase productivity and reduce reliance on the human operator. In addition to being very costly capital items, these machines are often designed and programmed for specific tasks—like robotic welders in car assembly operations—and are difficult to reprogram for different tasks than those for which they were conceived. They also usually are not suitable for mass-production of parts with design features at or below the millimeter. For instance, even using today's most advanced micromachining technologies, the drilling of precise holes of say 0.050 mm in diameter or less to a depth of several mm, would be an extremely difficult if not altogether impossible challenge.

Practically, tolerance capabilities vary widely from workshop to workshop, and indeed from machine tool operator to machine tool operator, and it is a common occurrence to find machining shops unable to make full use of the capabilities of modern machine tools for lack of experienced operators. In summary, only the best precision machining shops, like those found in the watch industry, are able to consistently maintain machining tolerances below 0.05 mm but this is usually only on small production batches and not for mass-produced items.

A number of new techniques, collectively grouped under the term 'micromolding' is currently generating great interest due to their potential to overcome the limitations of conventional machining. Clearly, the challenge of making micromolded parts is thus shifted to that of making micromolds.

One technique of fabricating micromolds uses a laser to machine patterned relief microstructures onto a polymer substrate. The machined polymer substrate is then electroplated and the metal inverse used as a micromold. The limitations in design are those of laser machining, i.e. limited definition, poor surface finish at the micrometer level, shallow depth of penetration, high capital investment, high operating cost, etc.

Another way in which the prior art has attempted to make micromolds is by first making oversized versions of these items by powder injection molding technology. After extraction of the organic binder, the green parts are sintered to their final density while undergoing volume shrinkage. An example of such efforts is disclosed in Wiech, Jr., U.S. Pat. No. 5,234,655 where, through a series of iterative cycles, micromolds are achieved. Each cycle consists of making a first green part in a first mold cavity. After sintering, during which the green part shrinks about 20% linearly, the product is used as a mold core in a second mold cavity and a second green part is produced and sintered in turn, upon which, it too, shrinks about 20% linearly to become a miniature of the first mold cavity. The cycle can, in principle, be repeated to produce smaller and smaller molds, each new mold being reduced in size with reference to the previous mold by an amount corresponding to the total shrinkage resulting from the inevitable double sintering step during each cycle. The inadequacy of this empirical method in achieving a precise overall shrinkage in the minimum number of cavity-core cycles, will be readily apparent to those skilled in the art, who will also understand the need to have a molding material that has a precisely predetermined and constant shrinkage factor engineered into it.

Another prior art avenue for making micromolds is by resorting to the manufacturing techniques used in the fabrication of integrated circuits (ICs) where thin material layers are iteratively deposited or selectively etched away on or from the surface of silicon wafers, making use of prior art techniques such as photolithography, molecular beam epitaxy (MBE), low pressure chemical vapor deposition (LPCVD), sputtering, reactive ion etch (RIE) processes, chemical mechanical polishing (CMP), etc.

In recent years these IC fabrication processes have been applied to fabricate mircomolds for so-called Micro-Electro-Mechanical Systems or MEMS, the millimeter to micrometer-scaled devices utilized in a growing number of commercial applications such as micromotors, actuators, sensors, heat exchangers, filters, microvalves and pumps, medical instruments, biomedical implants, etc.

The most basic method used to fabricate MEMS micromolds is to successively deposit and etch thin films of sacrificial polycrystalline silicon dioxide or and structural polycrystalline silicon layers, each about 2–4 $\mu$m thick. With each deposition/etch cycle protrusions are created. Other processes use silicon carbide as the structural material. The use of thin films, about 2–4 $\mu$m thick, has been cited as the major limitation to the development of MEMS micromolds. Also the deposition/etch cycles restrict design complexity.

For example, in Ghosh et al, U.S. Pat. No. 5,735,985 a first micromold is first created in a silicon wafer by dry etching technology. Next a soft stamp is produced by pouring silicone rubber over the etched surface and, after curing, the silicone replica is in turn used as a micromold.

Another problem stems from the fact that IC fabrication processes used to make MEMS micromolds are not universally accessible. Hence, many companies who would like to explore the potential of MEMS technology have limited options for getting devices prototyped or manufactured.

Yet another problem of the prior art is that advanced simulation and modeling tools for MEMS micromold design are still lacking, resulting in a relatively inaccurate prediction of dimensional accuracy. As a result, the MEMS design process is usually performed in a trial-and-error fashion requiring several iterations before the specification requirements are satisfied. This non-ideal design methodology combined with the length of time and high cost associated with MEMS prototyping results in a very inefficient and ineffective scenario for commercial product development. Frequently, the quality of MEMS micromolds fabricated at academic or commercial facilities is low. Part of the problem is that the technology is so new.

In conclusion, the prior art has not satisfactorily overcome the technical hurdles and high investment costs associated with the fabrication of micromolds.

BRIEF SUMMARY OF THE INVENTION

In accordance with the present invention the problems of the prior art are substantially overcome and the empirical, time-consuming, labor-intensive and costly tooling adjustments and iterations of the prior art substantially averted by providing a method to fabricate micromolds and micromold components by first forming green parts from a mixture of fine particulate materials and an organic binder. Substantially all of the organic binder is extracted from the green parts which are then sintered. During sintering the parts undergo a uniform, isotropic, constant and accurately predetermined shrinkage. By using the present invention parts of reduced size beyond the current limitations of micromachining can be realized.

OBJECTS AND ADVANTAGES

It is a primary object of this invention to overcome the dimensional and design limitations of the prior art by providing a method to fabricate parts, micromolds and micromold components of extremely small dimensions and having complex design features such as deep holes, rounded shapes, angled slots, threaded holes, etc., currently beyond the capabilities of the prior art.

Another object of this invention is to provide a method to fabricate extremely small parts, micromolds and micromolded parts without the prior art's trial and error methods and iterations to arrive at the correct final dimensions.

An additional object of this invention is to provide a method to fabricate extremely small parts, micromolds and micromolded parts without the material and energy wastage inherent to the prior art.

A further object of this invention is to provide a manufacturing process for extremely small parts, micromolds and micromolded parts which lends itself easily to automated mass-production as it makes use of well-known techniques such as casting, machining, molding, sintering, etc. It is, therefore also an object of this invention is to provide a micromanufacturing method that is easily accessible to a large number of users.

It is still a further object of this invention to provide an economical method to fabricate packages for MEMS devices.

Still another object of this invention is to provide a method to fabricate extremely small parts, micromolds and micromolded parts without the material limitations faced by the prior art.

BRIEF DESCRIPTION OF THE SEVERAL VIEWS OF THE DRAWINGS

Not applicable

DESCRIPTION OF THE PREFERRED EMBODIMENTS

As in the prior art, this invention starts by compounding a thermoplastic mixture, also called green mixture or green compound, consisting of two distinct and homogeneously dispersed phases, a discrete phase made up of fine particulate matter, and an organic continuous phase, generally termed the organic binder or simply the binder.

The discrete phase of the thermoplastic compound is made up of at least one finely divided particulate material, such as a ceramic or a metallic powder, however it is often made up of powders of different ceramic or metallic materials, either in elemental or prealloyed form, or even mixtures of these. The main directive in selecting the type of ingredients for the discrete phase will be the desired composition of the end product. For instance if the AMSI 316 L stainless steel composition is intended it will generally be advantageous to use a commercially available prealloyed atomized fine-grained stainless steel powder in which each of the powder particles is already of the AISI 316 L composition. An example of such a fine prealloyed powder is the MIM grade 316 L stainless steel powder from the Swedish firm Anval Nyby Powder AB which has a granulometry of 80% smaller than 22 micrometers. When a prealloyed powder is not available or is found unsuitable because of quality or cost factors, various elemental and prealloyed powders may be blended in the proper proportions so that, upon sintering, the desired end composition will be achieved. For example when the low CTE (coefficient of thermal expansion) alloy INVAR 36 is attempted, it may be advantageous to mix 64% by weight of iron carbonyl powder Grade E of the International Specialty Products (ISP) company, which has an average particle size of about 4–6 micrometers, with 36% of nickel carbonyl powder type 123 of the Inco Limited company, which has an average particle size of about 7–8 micrometers.

The continuous phase of the thermoplastic compound is made up of at least one thermoplastic organic material though generally it will be made up of several different organic constituents which may include polyolefin resins, silicones, waxes, oils, greases and the like. In most cases various organic surface active materials (surfactants), plasticizers and antioxidants will also be included to optimize the characteristics of the particulate materials and to avoid or retard premature oxidative degradation of the organic binder. Usually the binder will be specifically formulated for a given discrete phase in order to confer and optimize the thermoplastic compound's properties, such as its rheological behavior, solidification-, glass transition-, flow-and melting temperatures, as well as the thermal decomposition pattern of the organic binder.

The number of combinations and permutations possible at this point are very great and anyone skilled in the art will be well aware of the number of possibilities that exist to them to obtain the desired characteristics of the binder. However, a typical formula for the organic binder mixture would be approximately one-third by weight of polyethylene, one-third by weight of paraffin wax, one-third by weight of beeswax with perhaps 0.1 through 0.2 percent of stearic acid and 0.05% of an antioxidant added.

The discrete particulate materials and thermoplastic binder ingredients are mixed into a homogeneous mass at a temperature in excess of the melting point or flow point of the thermoplastic materials. Techniques for producing thermoplastic compounds are well described in the prior art and will not be elaborated on here.

The thermoplastic or green compound is formulated in such way that it is a solid at or below the normal room temperatures prevailing in temperate climates, i.e. usually below 25 degrees Celsius. At such temperatures the green compound can be machined by well-known conventional machining techniques such as milling, drilling, turning, reaming, punching, blanking, sawing, cutting, filing and the like. The thermoplastic compound in accordance with the present invention is totally recyclable.

For cold-forming machining operations such as milling, turning or blanking the thermoplastic mixture can be conveniently shaped into bar stock, billet or plate form at the time of formulation. If required, the feedstock's machinability can be increased by cooling it first.

If a heat-assisted forming technique such as casting, molding, laminating or extrusion is employed the green compound is advantageously pelletized at the time of formulation.

The organic binder is formulated so as to be extractable from the thermoplastic or green compound using well-known techniques such as aqueous or organic solvent extraction, oxidative degradation, catalytic decomposition, vacuum distillation, wicking and the like, leaving behind a framework that is substantially devoid of organic material. This binder-free structure can now be sintered to its final dense end configuration in accordance with prior art techniques. During sintering the open porosity, inevitably generated as a result of binder elimination, is gradually eliminated.

What is crucial in the application of this invention is that the exact volumetric ratio of discrete phase to that of the thermoplastic compound be established with the greatest possible accuracy. This ratio, also termed the volumetric loading or simply the loading of the thermoplastic compound, often designated by $\Phi$, can be expressed as:

$$\Phi = V_d/V_g \qquad (1)$$

where $V_d$ is the total volume of the discrete phase constituents and $V_g$ is the total green volume The conventional way to determine actual shrinkage upon sintering of thermoplastic compounds of the type described above is to make a test specimen of the green mixture, and to measure its dimensions before and after binder extraction and sintering. The ratio of the green to the corresponding sintered dimension constitutes the shrinkage factor, often designated by the letter K, thus:

$$K = L_g/L_s \qquad (2)$$

where $L_g$ is the length of the green dimension and $L_s$ the length of the sintered dimension The shrinkage factor is needed to calculate the dimensions of the green part, or those of the mold cavity when molding is the method used to form the green part. Equation (2) can be rewritten as:

$$K^3 = (L_g/L_s)^3 = L_g^3/L_g^3 = V_v/V_s \qquad (3)$$

where $V_s$ is the volume of a sintered cube of side $L_s$ and $V_g$ is the volume of the corresponding green cube of side $L_g$ Combining equations (1) and (3):

$$\Phi = (V_d/V_s) * K^3 \qquad (4)$$

Under steady state processing conditions, the term $V_d/V_s$ is a constant 'alloying factor' which can be determined for a given set of conditions. Equation (4) can be rewritten as:

$$\Phi = (M_d/\delta_d)/(M_s*\delta_s)*K^3 \qquad (5)$$

where $M_d$ and $\delta_d$ are, respectively, the mass and density of the total discrete phase and $M_s$ and $\delta_s$ are, respectively, the mass and density of the sintered part.

Assuming there is conservation of matter during sintering (i.e. no reaction sintering), $M_d = M_s$ and equation (5) becomes:

$$\Phi = (\delta_s/\delta_d)*K^3 = K^3 \qquad (6)$$

$$\text{where } C = \delta_s/\delta_d \qquad (7)$$

If C is different from unity, some atomic rearrangement has taken place during sintering and will affect the shrinkage factor.

In a preferred embodiment, the fabrication of micromolds and micromolded components which, due to their extreme small size, are difficult or impossible to make by conventional techniques is rendered possible by applying this invention.

EXAMPLE 1

Assuming a nickel micromold with design features of 500 nm is required but that the smallest micromold feasible by conventional silicon-based MEMS technology has a design limit of 1 $\mu$m. By applying this invention, the micromold made by silicon-based MEMS technology can be used to first make a nickel replica, which is then in turn used to fabricate the nickel micromold of the desired size. In order to achieve this, the linear shrinkage of the thermoplastic compound must be 29.3% so that the 1m design feature of the silicon technology-based MEMS micromold will first be reduced to 707 nm in the nickel replica and this dimension further reduced to 500 nm in the end product. Hence, the shrinkage factor K, as defined above, is 1.414.

A nickel powder such as Nickel Nanopowder #862 from Nanopowders Industries, Kfar-Saba, Israel, with average particle size of 0.05–0.10 µm is procured and its density, measured by precision helium gas pycnometry, found to be 8.63 g/cm³. Next a test specimen made from this powder is sintered and its sintered density, likewise determined by precision helium gas pycnometry, found to be 8.54 g/cm³.

Equation (6) yields $\Phi = 8.54/8.63 * (1.414)^{-3} = 0.35$.

A thermoplastic compound is formulated containing 35% by volume of nickel powder with the remaining 65% constituted by a thermoplastic binder of suitable characteristics in terms of rheology, TGA and DTA profiles, etc. The thus formulated thermoplastic compound can be cast or injected into a mold cavity incorporating the silicon-based MEMS micromold, in order to first produce the nickel replica and then, using the latter, the nickel micromold of the desired dimensions.

It is also possible, by applying this invention, to produce micromolds or micromold components, the geometry of which is out of the reach of silicon-based MEMS technology, for example parts like microscrews.

EXAMPLE 2

Assuming a zirconia (zirconium oxide) microscrew with a diameter of 130 µm and length of 2 mm is required and that the smallest screw made via conventional machining has diameter of 0.25 mm. Such a screw can be procured from the watch industry. The screw is placed in a suitable container and the thermoplastic compound of Example 1, heated to a temperature above its flowpoint, cast over it. After the compound has frozen, the original screw is unscrewed and the thus formed green nickel mold dewaxed and sintered, upon which its cavity shrinks by 29.3% to 0.176 mm. In order to achieve the desired diameter of 130 µm in the zirconia part, a further shrinkage of 26.14% is required, which implies a shrinkage factor K of 1.354 in the zirconia molding or casting compound.

A suitable zirconia powder, such as material Y-TZP from Daiichi Kigenso K.K. Co., Ltd., with an average particle size of 50 nanometers is procured and its density, measured by precision helium gas pycnometry, found to be 5.97 g/cm³. Next a test specimen made from this powder is sintered and its sintered density, likewise measured by precision helium gas pycnometry, found to be 6.03 g/cm³.

Equation (6) in this case yields: $\Phi = 6.03/5.97 * (1.354)^{-3} = 0.4069$.

Filling the cavity of the earlier produced nickel mold with a thermoplastic compound containing 40.69% by volume of zirconia powder with the remaining 59.31% constituted by a suitable thermoplastic binder, a green replica of the original screw is obtained which, following binder removal and sintering, yields the desired dimension of 130 µm. The desired length of 2 mm in the zirconia product is achieved by simply cutting the length of the original screw to 3.846 mm to match the overall shrinkage.

EXAMPLE 3

The present invention can also be used to correct an oversized MEMS micromold.

Assuming a MEMS micromold in which the tightest specified design feature is 100 nm±15 nm but, due to some manufacturing error, the actual part dimension is 120 nm. The dimensions of the defective MEMS micromold must thus be reduced by a factor of 1.2, which implies a corresponding shrinking factor K of $1.2^{1/2}$ or 1.095.

Using the zirconia powder of Example 2, equation (6) in this case yields:

$\Phi = 6.03/5.97 * (1.095)^{-3} = 0.7693$

Casting or molding a replica of the defective MEMS micromold using a thermoplastic compound containing 76.93% by volume of zirconia powder with the remaining 23.07% constituted by a suitable thermoplastic binder will, after binder extraction and sintering, yield a replica in which the oversized dimension of 120 nm has shrunk to 109.5 nm. A molding made in said sintered replica and using the same thermoplastic compound will, after binder extraction and sintering, yield a new MEMS micromold in which the defective dimension has been corrected to exactly 100 nm. Although this dimensional rectification procedure is obviously only of use to correct oversized dimensions, MEMS designers may make good use of it by appropriately shifting the manufacturing tolerances to the positive side.

As can be seen from the above examples, it is now possible, by applying the present invention, to achieve design features unattainable via prior art micromachining or micromolding technology, such as deep threaded holes or bosses, rounded or angled slots, etc.

Through the above illustrations it will also have become apparent to anyone skilled in the art that this invention allows the avoidance or reduction of the trial and error methods and iterations of the prior art in order to arrive at the correct final dimensions.

CONCLUSION, RAMIFICATIONS AND SCOPE

In conclusion, the major advantage of this invention resides in the ability to produce both moldable and non-moldable micromolds and micromold components from different sinterable materials, to precisely controlled and exacting dimensions, including miniature parts which, due to their small size, are presently not achievable by prior art forming techniques.

The practical uses of this invention are clearly broad in scope and universal and attempting to enumerate them all would not materially contribute to the description of this invention.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A method of forming a micromold having a cavity comprising
   a. providing a mold having a cavity which is substantially a mirror image of increased dimensions with reference to the cavity of the proposed micromold,
   b. providing sinterable particulates and determining their density,
   c. smtering said sinterable particulates and determining the density of the resulting sintered body,
   d. determining the ratio of said sintered density to the density of said sinterable particulates, e. determining the required shrinkage factor by dividing a dimension of said mold cavity by the corresponding dimension of the cavity of the proposed micromold, f. establishing the necessary volumetric fraction of said sinterable particulates in a uniform dispersion of said sinterable particulates in a thermoplastic organic binder in order to achieve said shrinkage factor by dividing said density ratio by the cube of said shrinkage factor, g. producing a green body which is a scaled-up replica of the proposed micromold by filling said mold cavity with said uniform dispersion of sinterable particulates in a thermoplastic organic binder, and h. extracting substantially all of the thermoplastic organic binder from said green body and sintering the ensuing binderfree body to obtain the desired micromold.

2. The method as set forth in claim 1 wherein the method of fabricating the mold having a cavity which is substantially a mirror image of increased dimensions with reference to the cavity of the proposed micromold comprises the steps of:

a. providing a mold having a cavity which is substantially a mirror image of increased dimensions with reference to the cavity of the mold having a cavity which is substantially a mirror image of increased dimensions with reference to the cavity of the proposed micromold, b. producing a green body by filling said mold cavity with a uniform dispersion of sinterable particulates in a thermoplastic organic binder, c. extracting substantially all of the thermoplastic organic binder from said green body and sintering the ensuing binderfree body to obtain a sintered body which is a diminutive replica of said green body, and d. inserting said sintered body into the cavity of a second mold to obtain the desired mold having a cavity which is substantially a mirror image of increased dimensions with reference to the cavity of the proposed micromold.

3. The method as set forth in claim 1 wherein said sinterable particulates are micrometer-sized or nanometer-sized particulates.

4. The method as set forth in claim 1 wherein said sinterable particulates are selected from the class of metals and their alloys, ceramics and their alloys and mixtures of metals and ceramics or their alloys.

5. The method as set forth in claim 1 wherein said micromold is used to produce MEMS devices.

6. The method as set forth in claim 1, further comprising producing MEMS packages using the micromold.

7. The method as set forth in claim 1, wherein a plurality of micromolds are formed of identical composition but of different dimensions using a single mold.

* * * * *